United States Patent
Han et al.

(10) Patent No.: US 11,251,243 B2
(45) Date of Patent: Feb. 15, 2022

(54) ORGANIC LIGHT EMITTING DISPLAY DEVICE

(71) Applicant: LG Display Co., Ltd., Seoul (KR)

(72) Inventors: Jeonphill Han, Paju-si (KR); Jiheun Lee, Paju-si (KR); Sangkyu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 218 days.

(21) Appl. No.: 16/567,836

(22) Filed: Sep. 11, 2019

(65) Prior Publication Data
US 2020/0091259 A1 Mar. 19, 2020

(30) Foreign Application Priority Data
Sep. 14, 2018 (KR) .......................... 10-2018-0110399

(51) Int. Cl.
*H01L 27/32* (2006.01)
(52) U.S. Cl.
CPC ...... *H01L 27/3246* (2013.01); *H01L 27/3258* (2013.01); *H01L 27/3262* (2013.01)

(58) Field of Classification Search
CPC ............. H01L 27/3246; H01L 27/3258; H01L 27/3262; H01L 51/0005; H01L 27/3248; H01L 51/56; H01L 2227/323
See application file for complete search history.

(56) References Cited

U.S. PATENT DOCUMENTS

| 2015/0060810 A1* | 3/2015 | Han | H01L 27/3246 257/40 |
| 2018/0190736 A1* | 7/2018 | Kim | H01L 27/3246 |

* cited by examiner

*Primary Examiner* — Kyoung Lee
(74) *Attorney, Agent, or Firm* — Seed Intellectual Property Law Group LLP

(57) ABSTRACT

The present disclosure provides an organic light-emitting display device having a plurality of pixels arranged along first and second directions that intersect each other. Each of the pixels includes: a transistor; at least one insulating layer on the transistor, and a pixel contact hole extends through the insulating layer and exposes part of the transistor; a first electrode on the at least one insulating layer and connected to the transistor via the pixel contact hole; and a filling layer on the first electrode and filling the pixel contact hole. A first bank has a plurality of first openings, and each of the first openings exposes at least one of the first electrodes. A second bank has a plurality of second openings, and each of the second openings exposes a plurality of the first electrodes arranged along the second direction.

19 Claims, 15 Drawing Sheets

ORGANIC LIGHT EMITTING DISPLAY DEVICE

CROSS-REFERENCE TO RELATED APPLICATION(S)

This application claims the priority benefit of Korean Patent Application No. 10-2018-0110399 filed on Sep. 14, 2018, which is incorporated herein by reference for all purposes as if fully set forth herein.

BACKGROUND

Technical Field

The present disclosure relates to an organic light-emitting display device that has a plurality of bank structures.

Description of the Related Art

Recently, various display devices that are less bulky and more lightweight than cathode ray tubes (CRTs) are being developed. Examples of these display devices include liquid crystal displays (LCDs), plasma display panels (PDPs), field emission displays (FEDs), organic light-emitting display devices, etc.

The organic light-emitting display devices are self-luminous devices, and offer several advantages such as fast response time, high light emission efficiency, high brightness, and wide viewing angle. Moreover, the organic light-emitting display devices may be implemented as a flexible display device because they can be fabricated on a flexible substrate such as plastic.

In keeping with the recent trend towards large-area, high-resolution organic light-emitting display devices, a single panel comprises a plurality of sub-pixels. Generally, masks are used to pattern red (R), green (G), and blue (B) sub-pixels. Thus, a large-area, high-resolution display device requires a corresponding large-area fine metal mask (FMM). However, a mask is bent as the area thereof increases to causes various problems such as deposition of an organic light-emitting material forming an emission layer at an incorrect position.

As a way to solve the problems of the aforementioned method of deposition using a mask, a solution process is getting attention because it is simple to implement and has advantages in large-area display devices. The solution process enables large-area patterning through inkjet printing or nozzle printing, without using a mask, and has a material use rate of 50 to 80%, which is very high compared to vacuum deposition which has a material use rate no higher than 10%. Also, the solution process offers good thermal stability and morphological properties because it provides a higher glass transition temperature than vacuum-deposited thin films.

BRIEF SUMMARY

An aspect of the present disclosure is to provide an organic light-emitting display device that has a plurality of bank structures.

An exemplary embodiment of the present disclosure provides an organic light-emitting display device including a plurality of pixels arranged along first and second directions that intersect each other, and each of the pixels includes: a transistor; at least one insulating layer on the transistor, a pixel contact hole extending through the at least one insulating layer and exposing part of the transistor; a first electrode on the at least one insulating layer and connected to the transistor via the pixel contact hole; and a filling layer on the first electrode and filling the pixel contact hole. A first bank has a plurality of first openings, and each of the first openings exposes at least one of the first electrodes. A second bank has a plurality of second openings, and each of the second openings exposes a plurality of the first electrodes arranged along the second direction.

In another embodiment, the present disclosure provides an organic light-emitting display device that includes a plurality of pixels arranged in rows extending along a first direction and columns extending along a second direction transverse to the first direction. Each of the pixels includes an organic light-emitting diode having a first electrode. A first bank has a plurality of first openings, and each of the first openings exposes a first plurality of the first electrodes along the first direction. A second bank having a plurality of second openings, and each of the second openings exposes a second plurality of the first electrodes along the second direction. Each of the plurality of first openings overlaps two or more of the second openings.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
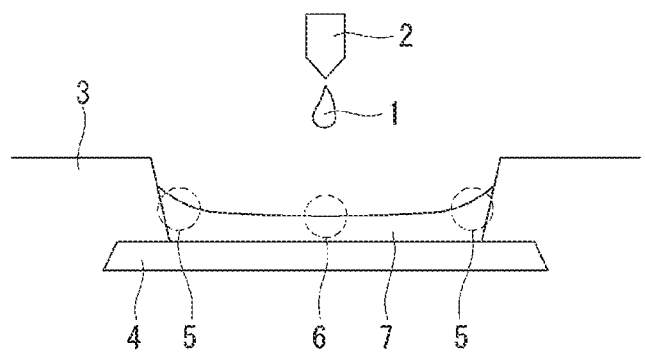
FIG. 1 is a schematic diagram for explaining problems of a solution process.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

FIG. 1 is a schematic diagram for explaining problems of a solution process.

Referring to FIG. 1, forming an organic light-emitting layer using a solution process (or soluble process) has the problem of deteriorating the light emission characteristics of organic light-emitting display devices due to pileup. More specifically, an organic light-emitting material 1 is applied onto (or dropped onto) a first electrode 4 divided up by a bank 3 by inkjet equipment 2 or the like. The applied organic light-emitting material 1 has varying thicknesses depending on the position, due to differences in hardening rate in the hardening process. That is, a non-uniform organic light-emitting layer 7 is formed which is thick at the edge 5 adjoining the bank and thin at the center 6.

The formation of the non-uniform organic light-emitting layer 7 can bring about the problem of deterioration in display quality because brightness varies with position. In addition, the lifetime of the device can degrade due to differences in current density within the organic light-emitting layer 7, or the process yield can be lowered due to formation of dark spots. In view of this, there is a need to reduce the pile-up area as much as possible when forming the emission layer by using the solution process.

Figure 2:
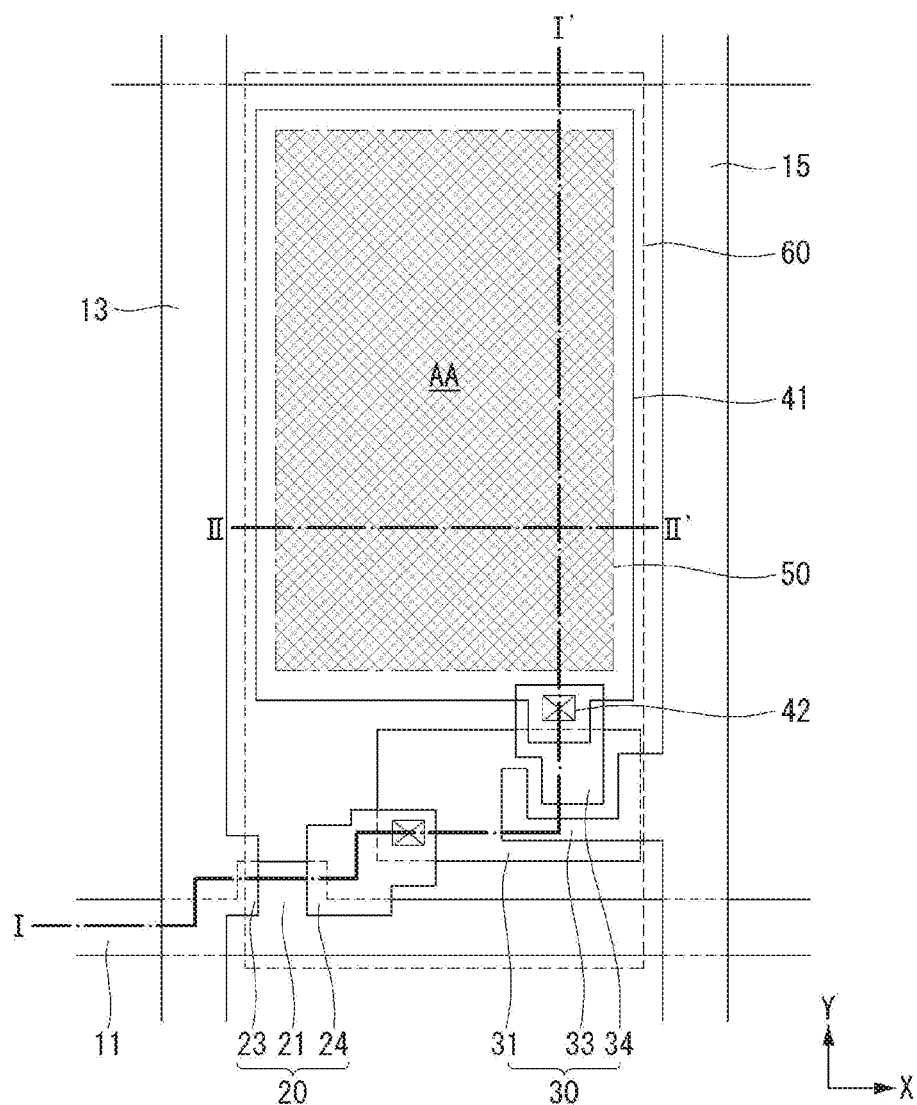
FIG. 2 is a plan view of an organic light-emitting display device, in accordance with one or more embodiments.
Figure 3:
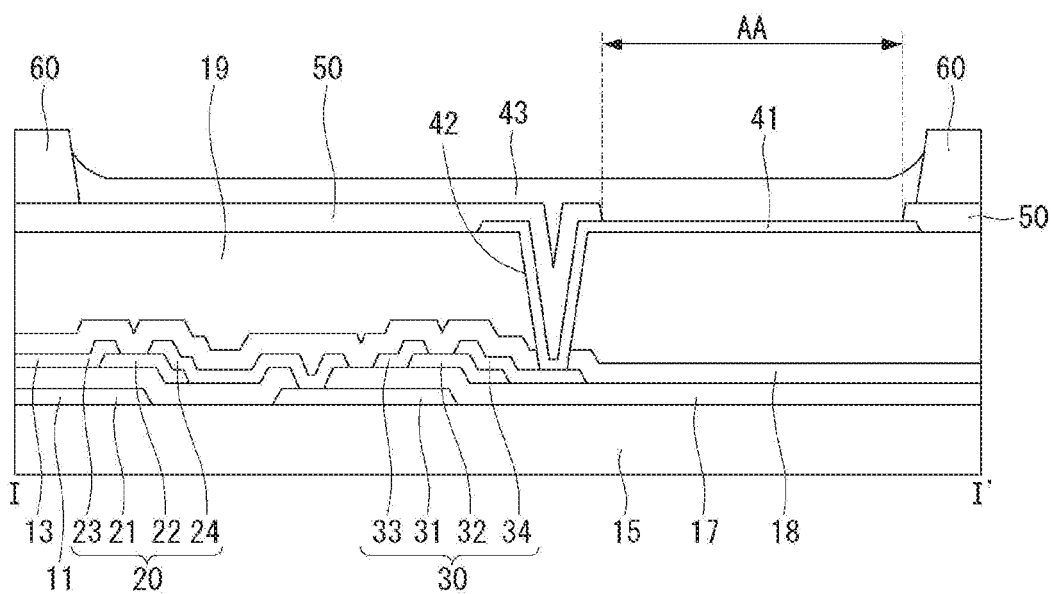
FIG. 3 is a cross-sectional view taken along the line I-I' in FIG. 2.
Figure 4:
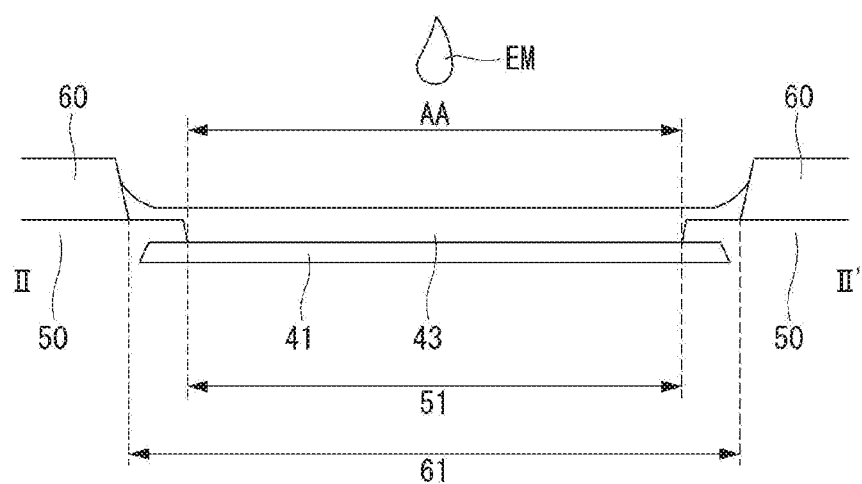
FIG. 4 is a cross-sectional view taken along the line II-II' in FIG. 2.

FIG. 2 is a plan view of an organic light-emitting display device. FIG. 3 is a cross-sectional view taken along the line I-I' in FIG. 2. FIG. 4 is a cross-sectional view taken along the line II-II' in FIG. 2.

Referring to FIGS. 2 to 4, the organic light-emitting display device according to the present disclosure comprises a substrate having sub-pixels. The pixels may be arranged on a substrate (for example, in a matrix) along the first direction (e.g., X-axis direction) and second direction (e.g., Y-axis direction) which intersect each other. For example, the pixels may be arranged in a plurality of rows extending along the first direction, and a plurality of columns extending along the second direction. Each pixel may be defined by the intersection of a scan line 11, a data line 13, and a driving current line 15, but is not limited thereto. Each pixel comprises thin-film transistors (hereinafter, "TFTs") and an organic light-emitting diode electrically connected to the TFTs. The organic light-emitting diode comprises a first electrode 41 connected to the TFTs, a second electrode facing the first electrode 41, and an organic light-emitting layer 43 interposed between the first electrode 41 and the second electrode. The first electrode 41 may be an anode, and the second electrode may be a cathode.

The TFTs comprise a switching TFT 20 and a driving TFT 30 connected to the switching TFT 20. The switching TFT 20 is formed at or near an intersection of a scan line 11 and a data line 13, and functions to select a pixel. The switching TFT 20 comprises a gate electrode 21 branching off from the scan line 11, a semiconductor layer 22, a source electrode 23, and a drain electrode 24. The driving TFT 30 serves to drive the organic light-emitting diode of the pixel selected by the switching TFT 20. The driving TFT 30 comprises a gate electrode 31 connected to the drain electrode 24 of the switching TFT 20, a semiconductor layer 32, a source electrode 33 branching off from a driving current line 15, and a drain electrode 34. The drain electrode 34 of the driving TFT 30 is connected to the first electrode 41.

A first bank 50 is formed so as to cover the switching TFT 20, driving TFT 30, and various wiring lines 11, 13, and 15. The first bank 50 comprises a plurality of first openings 51. The first openings 51 expose at least part of the first electrode 41 of a respective pixel. Parts of the first electrodes 41 exposed by the first bank 50 may be defined as light-emitting regions AA.

In an example, the first bank 50 may be formed in such a manner as to cover the edges of the first electrodes 41, and expose most of the center of the first electrodes 41. In this case, the boundary of the first openings 51 determines the planar shape of the first openings 51. The boundary of the first electrodes 41 determines the planar shape of the first electrodes 41. Although the drawings illustrate that the first openings 51 are approximately rectangular, they are not limited to this shape, and the first openings 51 may have various different shapes in various embodiments.

The second bank 60 is formed over the first bank 50. The second bank 60 comprises a plurality of second openings 61. The second opening 61 covers part of the first bank 50. For example, the second openings 61 may at least partially expose portions of the first bank 50. The second openings 61 expose at least part of the first electrode 41 of a respective pixel. The second openings 61 extend in the first direction.

The second openings 61 may be formed to have a larger area than the first openings 51 and receive the first openings 51 within them. That is, the boundary of the second openings 61 may be located on the outside of boundary of the first openings 51, at a preset or selected distance from it. The boundary of the second openings 61 determines the planar shape of the second openings 61.

More specifically, TFTs are placed on the substrate 10 of the organic light-emitting display device. For example, the gate electrodes 21 and 31 of the switching TFT 20 and driving TFT 30 are formed on the substrate 10. A gate insulating film 17 is formed over the gate electrodes 21 and 31. The semiconductor layers 22 and 32 partially overlapping the gate electrodes 21 and 31 are formed over the gate insulating film 17. Parts of the semiconductor layers 22 and 32 overlapping the gate electrodes 21 and 31 may be defined as channel regions.

The source electrodes 23 and 33 and the drain electrodes 24 and 34 are formed over the semiconductor layers 22 and 32, spaced apart from each other. The source electrodes 23 and 33 make contact with one end of the semiconductor layers 22 and 32, and the drain electrodes 24 and 34 make contact with the other end of the semiconductor layers 22 and 32. The drain electrode 24 of the switching TFT 20 makes contact with the gate electrode 31 of the driving TFT 30 via a contact hole penetrating the gate insulating layer 17. The TFTs applied to an exemplary embodiment of the present disclosure is not limited to the structure illustrated in the drawings, but may include various structures such as a bottom gate structure and a double gate structure.

An insulating layer is formed over the gate insulating film 17 and the TFTs 20 and 30. For example, the insulating layer may comprise a first insulating film 18 and a second insulating film 19, as shown in the drawings. The first insulating film 18 may comprise an inorganic insulating material, and the second insulating film 19 may comprise an organic insulating material. The second insulating film 19 may function as a planarization layer comprising an organic insulating material. For convenience of explanation, a description will be given below of a structure in which the first insulating film and the second insulating film are sequentially formed.

The first electrodes 41 are formed over the second insulating film 19. Each first electrode 41 is connected to the drain electrode 34 of the driving TFT 30 via a pixel contact hole 42 penetrating the first insulating film 18 and second insulating film 19.

The first bank 50 is formed on the substrate 10 where the first electrodes 41 are formed. The first bank 50 may be made relatively thin so as to be covered by the organic light-emitting layer 43 to be formed later. The first bank 50 may be formed of a hydrophilic insulating material. In an example, the first bank 50 may be formed of a hydrophilic inorganic insulating material such as silicon oxide (SiO2) or silicon nitride (SiNx). The hydrophilic nature of the first bank 50 allows the organic light-emitting material EM constituting the organic light-emitting layer 43 to spread well on the first bank 50.

The first bank 50 has a first opening 51 that exposes at least part of the first electrode 41. The first bank 50 may function as a definition layer that defines a light-emitting region AA on the first electrode 41.

The second bank 60 is formed on the substrate 10 where the first bank 50 is formed. The second bank 60 is hydrophobic. In an example, the second bank 60 may be formed with a hydrophobic material coated on an organic insulating material or formed with an organic insulating material containing a hydrophobic material. The hydrophobic nature of the second bank 60 may function to push the organic light-emitting material EM constituting the organic light-emitting layer 43 so that it collects at the center of the light-emitting region AA. Also, the second bank 60 may function as a barrier that encloses the organic light-emitting materials EM applied to a corresponding region, so as to prevent organic light-emitting materials EM of different colors from being mixed together.

The second bank 60 has a second opening 61 that exposes at least part of the first electrode 41. The second opening 61 is located on the outside of the first opening 51, at a preset or selected distance from it. Thus, the first opening 51 may be exposed by the second opening 61.

The organic light-emitting layer 43 is formed on the substrate 10 where the second bank 60 is formed. The organic light-emitting material EM used to form the organic light-emitting layer 43 in the solution process is applied in such a way as to cover at least part of the first electrode 41, part of the first bank 50, and part of the second bank 60. The first bank 50 is a hydrophilic thin film provided to prevent a wettability problem due to the hydrophobic nature of the first electrode 41, and allows the hydrophilic, organic light-emitting material EM to spread well. The second bank 60 is a hydrophobic thick film that can push the hydrophilic organic light-emitting material EM to the center. By the combined structure of the first bank 50 and the second bank 60, the organic light-emitting layer 43 may be made uniform or substantially uniform in thickness in the light-emitting regions AA.

The organic light-emitting display device according to the present disclosure may prevent deterioration in the uniformity of the organic light-emitting layer 43, thereby preventing a decrease in display quality due to varying thicknesses depending on the position. Moreover, a decline in the device's lifetime or imperfections like dark spot formation may be prevented by ensuring the uniformity of the organic light-emitting layer 43.

First Exemplary Embodiment

Figure 5A:
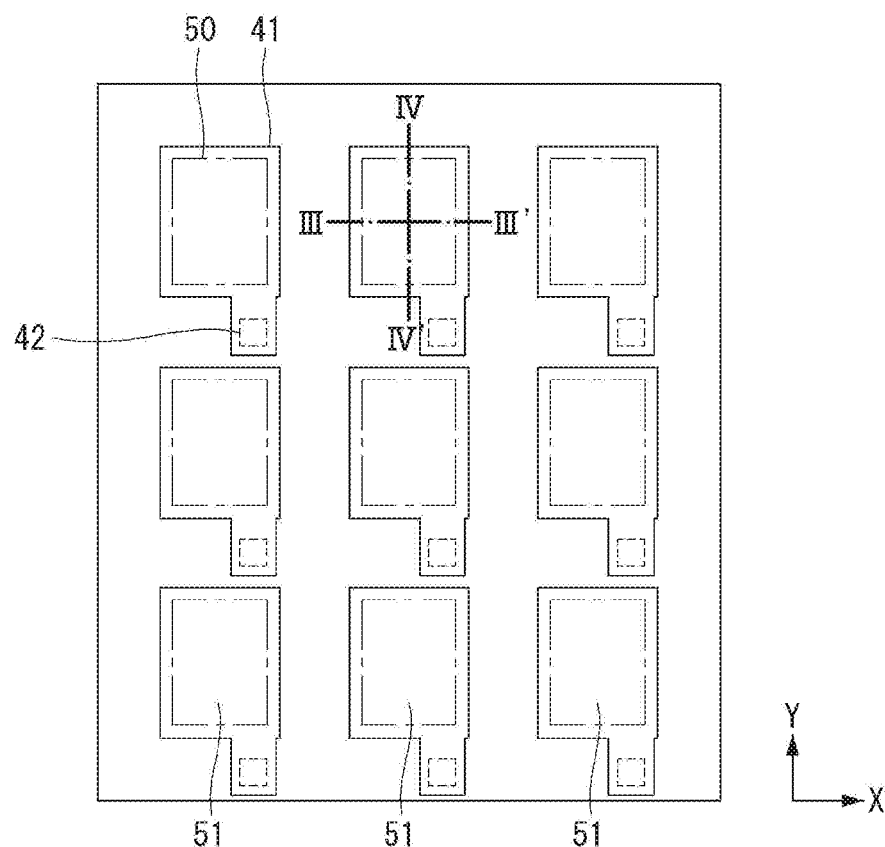
FIGS. 5A, 6A, and 7A are plan views showing a process of forming first electrodes, a first bank, a second bank, and an organic light-emitting layer according to a first exemplary embodiment of the present disclosure.
Figure 5B:
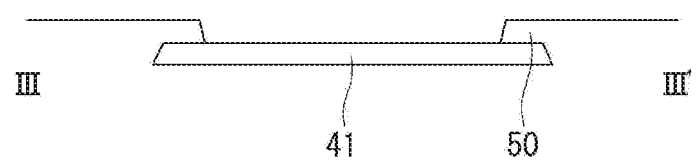
FIGS. 5B, 6B, and 7B are cross-sectional views taken along the lines of FIGS. 5A, 6A, and 7A, respectively.
Figure 5C:
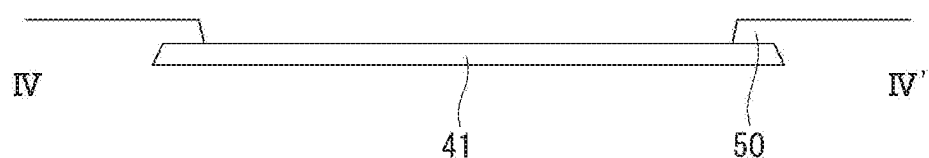
FIGS. 5C, 6C, and 7C are cross-sectional views taken along the lines IV-IV' of FIGS. 5A, 6A, and 7A, respectively.
Figure 6A:
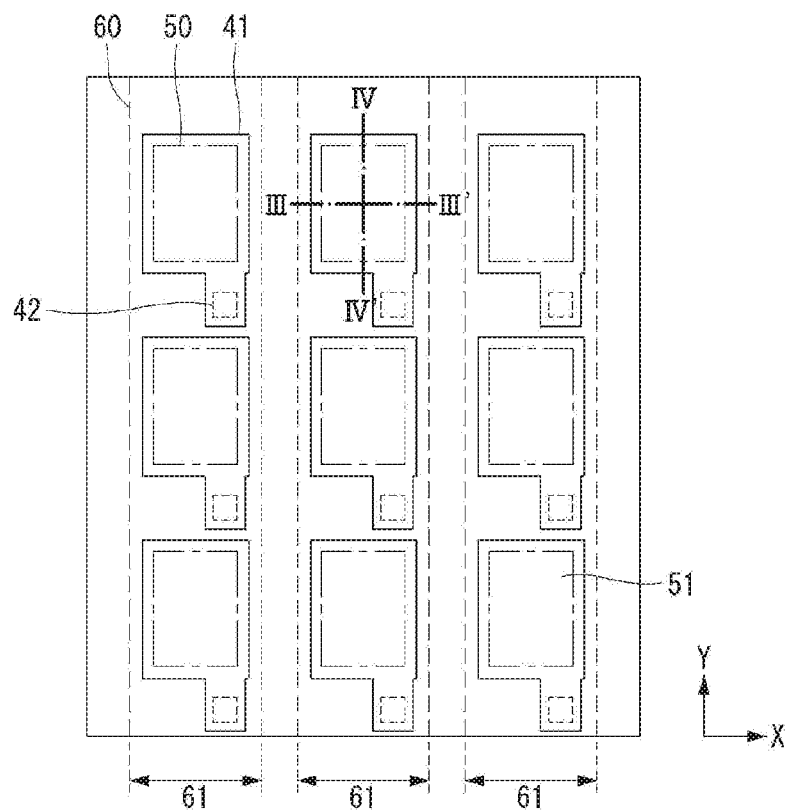
Figure 6B:
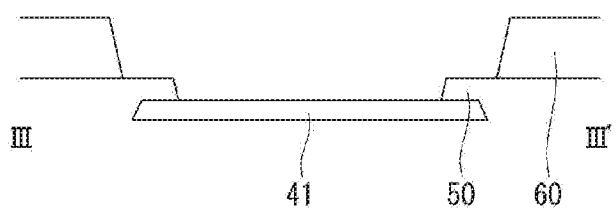
Figure 6C:
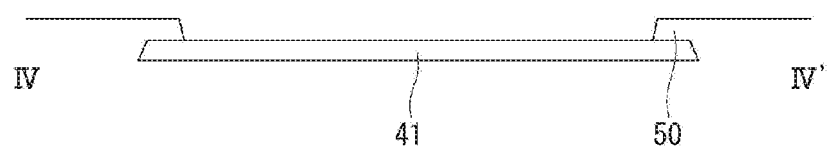
Figure 7A:
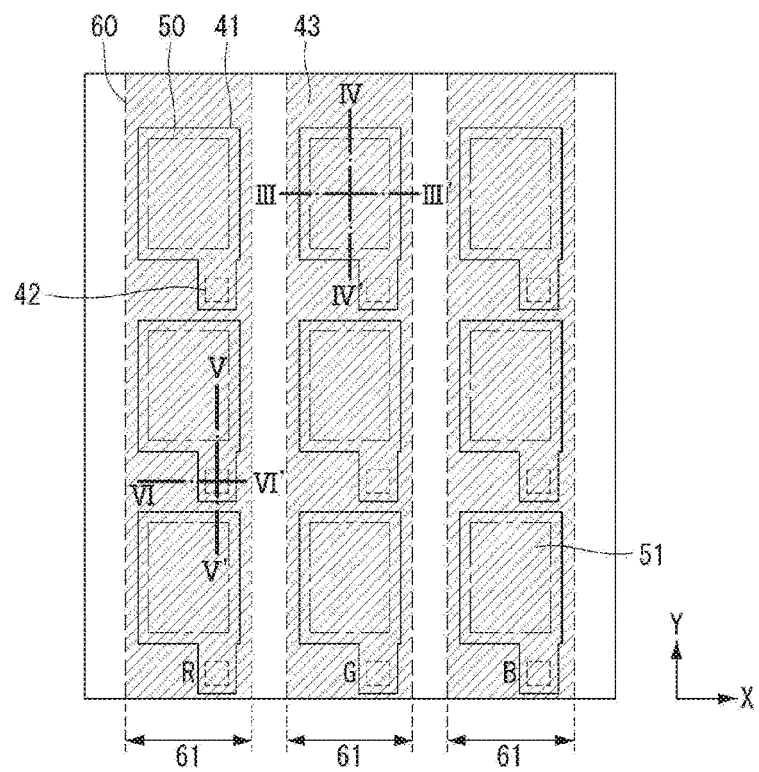
Figure 7B:
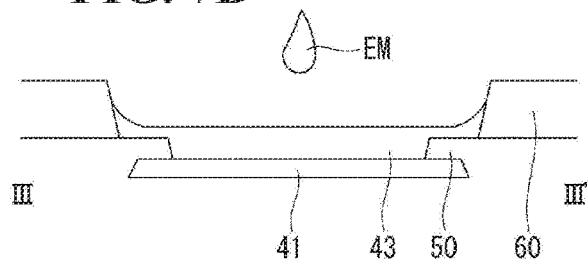
Figure 7C:
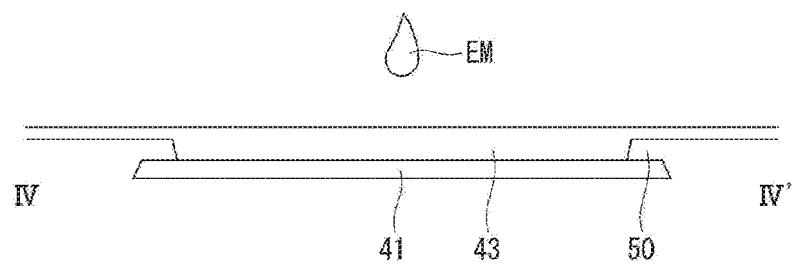

Hereinafter, an organic light-emitting display device according to a first exemplary embodiment of the present disclosure will be described with reference to FIGS. 5 to 11. FIGS. 5 to 7 are views showing a process of forming first electrodes, a first bank, a second bank, and an organic light-emitting layer according to a first exemplary embodiment of the present disclosure. More particularly, FIGS. 5A, 6A, and 7A are schematic plan views illustrating the process of forming the first electrodes, first bank, second bank, and organic light-emitting layer, FIGS. 5B, 6B, and 7B are cross-sectional views taken along the line of FIGS. 5A, 6A, and 7A, respectively, and FIGS. 5C, 6C, and 7C are cross-sectional views taken along the line IV-IV' of FIGS. 5A, 6A, and 7A, respectively. For convenience of explanation, the process and structure prior to the formation of the first electrodes 41 will be omitted.

Referring to FIGS. 5A, 5B, and 5C, the organic light-emitting display device comprises pixels arranged in first and second directions intersecting each other. Each pixel has a first electrode 41.

A first bank 50 is formed on a substrate where the first electrodes 41 are formed. The first bank 50 comprises a plurality of first openings 51. The first opening 51 exposes at least part of the first electrode 41. Each first opening 51 exposes one first electrode 41. Thus, the number of first electrodes 51 and the number of first electrodes 41 may be equal.

Although the drawings illustrate that the first openings 51 are approximately rectangular, they are not limited to this shape. Also, the drawings illustrate that all of the first openings 51 have the same shape and area, but they are not limited to this and at least one first opening 51 may have a different shape and/or area from another first opening 51. For example, the shape and/or area of the first openings 51 may be selected as desired in view of design considerations such as the lifetime of organic light-emitting materials EM. Parts of the first electrodes 41 exposed by the first openings 51 may be defined as light-emitting regions.

Referring to FIGS. 6A, 6B, and 6C, the second bank 60 is formed on the substrate where the first bank 50 is formed. The second bank 60 comprises a plurality of second openings 61. The second opening 61 exposes at least part of the first electrode 41. A plurality of second openings 61 are arranged in parallel in the second direction, for example, each of the plurality of second openings 61 may have a long-axis that extends in the second direction (e.g., the Y-axis direction, as shown in FIG. 6A). Each of the second openings 61 extends in the second direction and exposes a plurality of first electrodes 41 arranged along the second direction, respectively. For example, as shown in FIG. 6A, each of the second openings 61 may expose a plurality of first electrodes 41 which are arranged along the Y-axis direction. Alternatively, the second openings 61 may extend in the first direction and expose a plurality of first openings 51 arranged along the first direction, respectively. The number of first electrodes 41 or first openings 51 exposed by one second opening 61 may be different from the number of first electrodes 41 or first openings 51 exposed by another second opening 61.

Although the drawings illustrate that the second openings 61 are approximately rectangular, they are not limited to this shape, and the second openings 61 may have various different shapes in various embodiments. Also, the drawings illustrate that all of the second openings 61 have the same shape and area, but they are not limited to this and at least one second opening 61 may have a different shape and/or area from another second opening 61. For example, the shape and/or area of the second openings 61 may be selected as desired in view of design considerations such as the lifetime of organic light-emitting materials EM.

Referring to FIGS. 7A, 7B, and 7C, the organic light-emitting layer 43 is formed on the substrate where the second bank 60 is formed. The organic light-emitting material EM forming the organic light-emitting layer 43 may be formed within the corresponding second openings 61, in the direction in which the second openings 61 extend. Thus, the applied organic light-emitting material EM covers parts of the first electrodes 41 and first bank 50 exposed by the second openings 61. In at least some embodiments, the organic light-emitting material EM may contact inner side surfaces of the second bank 60, e.g., at inner side surfaces of the second bank 60 which form the boundary of the second openings 61. The planar shape of the organic light-emitting layer 43 may correspond to the planar shape of the second openings 61. For example, the organic light-emitting layer 43 may have a striped pattern that extends in a planar view. For example, as shown in FIG. 7A, the organic light-emitting layer 43 may extend along the second direction (e.g., the Y-axis direction) and may have a shape that corresponds to the shape of the second openings 61 (which also extend along the second direction).

Organic light-emitting materials EM of different colors may be sequentially and alternately applied in their corresponding second openings 61. The organic light-emitting materials EM of different colors may comprise organic light-emitting materials EM that emit red (R), green (G), and blue (B) light, and in some embodiments, may further comprise an organic light-emitting material EM that emits white (W) light.

Organic light-emitting material EM of the same color is applied on at least a plurality of first electrodes 41 exposed by one second opening 61. This means that a plurality of pixels defined at positions corresponding to one second opening 61 emit light of the same color. The second bank 60 is located between the first electrodes 41 adjacent to each other in the first direction (e.g., the X-axis direction), so that the organic light-emitting materials EM of different colors placed in the corresponding second openings 61 are kept from being mixed together.

Here, the first bank 50 is hydrophilic, and the second bank 60 is hydrophobic. Since there is a trade-off relationship between the hydrophilic nature of the first bank 50 and the hydrophobic nature of the second bank 60, the first openings 51 of the first bank 50 and the second openings 61 of the second bank 60 should be designed in consideration of the hydrophilic nature and the hydrophobic nature, in order to ensure the uniformity of the organic light-emitting layer.

Specifically, the boundary of the first bank 50 should be spaced a preset or selected distance apart from the boundary of the second bank 60. The preset or selected distance between the boundary of the first bank 50 and the boundary of the second bank 60 may be, in some embodiments, a minimum distance at which the organic light-emitting layer can have uniform thickness. If the distance between the boundary of the first bank 50 and the boundary of the second bank 60 is shorter than the preset or selected distance, the organic light-emitting layer 43 cannot be made uniform in thickness. If the distance between the boundary of the first bank 50 and the boundary of the second bank 60 is longer than the preset or selected distance, the area of the first electrodes 41 which are enclosed by the first bank 50 increases, which can cause problems like a small aperture ratio.

In the organic light-emitting display device according to the first exemplary embodiment of the present disclosure, the second openings 61 of the second bank 60 extend in the second direction (e.g., the Y-axis direction), so that the second bank 60 is not located between the pixels adjacent to each other in the second direction. Hence, in the first exemplary embodiment of the present disclosure, the aforementioned positional constraints on the first bank 50 become relatively loose, thereby improving the degree of design freedom and providing wide light-emitting regions AA on the first electrodes 41. Therefore, the first exemplary embodiment of the present disclosure may provide an organic light-emitting display device that offers a higher degree of design freedom and ensures a sufficiently large aperture ratio.

Figure 8:
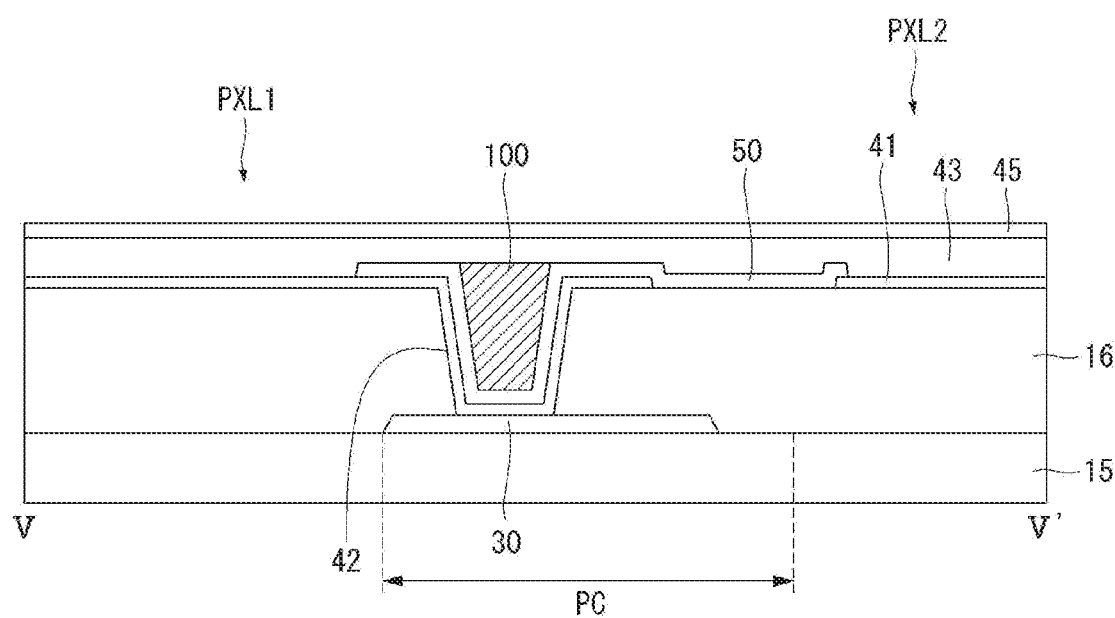
FIG. 8 a cross-sectional view showing an example configuration according to the first exemplary embodiment of the present disclosure, taken along the line V-V' of FIG. 7A.

FIG. 8 a cross-sectional view showing an example configuration according to the first exemplary embodiment of the present disclosure, taken along the line V-V' of FIG. 7A.

Referring to FIG. 8, as described above, in the organic light-emitting display device according to the first exemplary embodiment of the present disclosure, the second openings 61 of the second bank 60 extend in the second direction, so only the first bank 50, but not the second bank 60, is located between the pixels PXL1 and PXL2 adjacent to each other in the second direction. The first bank 50, within the second opening 61, separates the pixels PXL1 and PXL2 adjacent to each other in the first direction, and is placed in such a way as to cover a pixel circuit portion PC of at least one of the pixels PXL1 and PXL2 adjacent to each other in the first direction.

More specifically, the organic light-emitting display device according to the first exemplary embodiment of the present disclosure comprises a TFT 30 placed on the substrate and an organic light-emitting diode electrically connected to the TFT 30. The organic light-emitting diode comprises a first electrode 41, a second electrode 45, and an organic light-emitting layer 43 interposed between the first electrode 41 and the second electrode 45. The TFT 30 is placed in the pixel circuit portion PC of the corresponding pixel. The TFT 30 and the first electrode 41 of the organic light-emitting diode are connected via a pixel contact hole 42 penetrating an insulating layer 16 interposed between them.

The first bank 50 is placed in the pixel circuit portion PC, on the substrate where the first electrode 41 is formed. The first bank 50 should be made relatively thin since it is an element covered by the organic light-emitting layer 43 as described above. Thus, the first bank 50 is formed along a stepped portion formed by the pixel contact hole 42, and its upper surface is not flattened but has a stepped portion corresponding to the stepped portion formed by the pixel contact hole 42. In other words, the pixel contact hole 42 is not filled with the first bank 50, in some embodiments, but instead the first bank 50 may extend into the pixel contact hole 42 without filling the pixel contact hole 42. The first bank 50 may have a stepped structure, for example, in which the first bank 50 forms a step between a portion of the first bank 50 located within the pixel contact hole 42 and a portion of the first bank 50 located outside of the pixel contact hole 42.

The organic light-emitting display device according to the first exemplary embodiment of the present disclosure further comprises the filling layer 100 for filling the pixel contact hole 42. The filling layer 100 is provided to fill the pixel contact hole 42, and prevents the organic light-emitting material forming the organic light-emitting layer 43 from entering the pixel contact hole 42 before hardening. If the filling layer 100 is not provided, the organic light-emitting material may locally enter only the pixel contact hole 42 formed in one region. This causes a difference in the thickness of the organic light-emitting layer 43 between the region the organic light-emitting material enters and the other regions, thereby leading to a significant deterioration in the display quality of the display device. By including the filling layer 100, the first exemplary embodiment of the present disclosure may prevent the problem of deterioration in the thickness uniformity of the organic light-emitting layer 43 which occurs when organic light-emitting material unintentionally enters the pixel contact hole 42. In various embodiments, the filling layer 100 may be formed of any dielectric material or electrically insulating material.

Moreover, the pixel contact hole 42 is made thick and deep due to the process characteristics, because it is formed through the insulating layer 16 with a relatively large thickness. Since the first bank 50 is formed along the stepped portion of the pixel contact hole 42, it may be possible that portions of the first bank 50 do not fully cover the first electrode 41 placed in the pixel circuit portion PC but may be divided in one region and may expose the first electrode 41. In this case, the first electrode 41 and the organic light-emitting layer 43 may come into contact with each other in the exposed region, thus causing the problem of abnormal light emission. However, in the first exemplary embodiment of the present disclosure, the filling layer 100 is placed on the first bank 50 within the pixel contact hole 42, so the corresponding region may be masked through the filling layer 100. That is, any portions of the first electrode 41 that are not fully covered by the first bank 50 within the pixel contact hole 42 are covered by the filling layer 100, thereby preventing contact between the first electrode 41 and the organic light-emitting layer 43 in the pixel contact hole 42. Accordingly, the first exemplary embodiment of the present disclosure has the advantage of preventing abnormal light emission even if the first bank 50 is divided or discontinuous within the pixel circuit portion PC.

Figure 9:
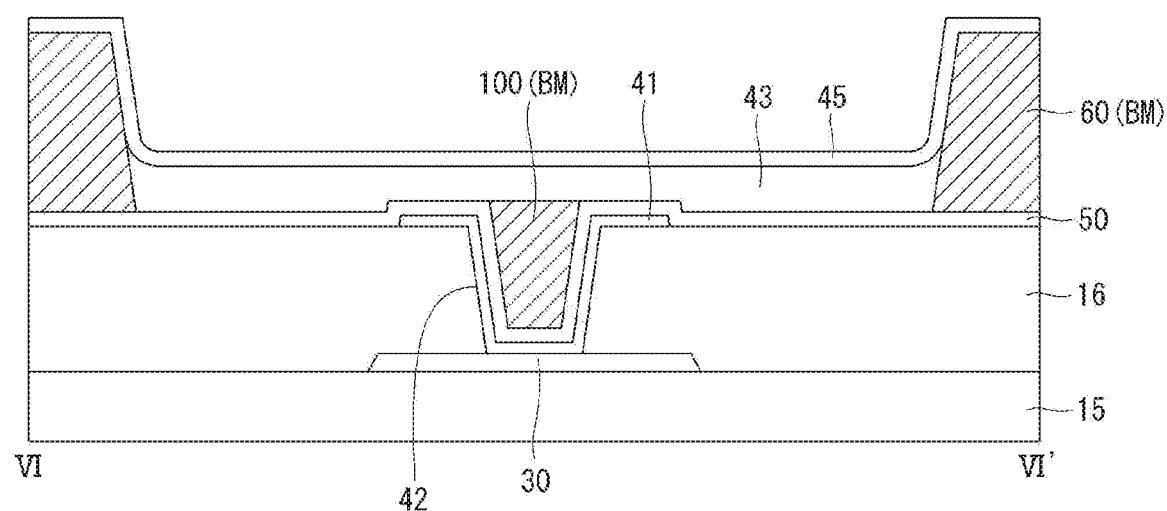
FIG. 9 a cross-sectional view showing a an example configuration according to the first exemplary embodiment of the present disclosure, taken along the line VI-VI' of FIG. 7A.

FIG. 9 a cross-sectional view showing an example configuration according to the first exemplary embodiment of the present disclosure, taken along the line VI-VI' of FIG. 7A.

Referring to FIG. 9, the filling layer 100 may be formed on the first bank 50 and made of the same material BM as the second bank 60. That is, the filling layer 100 may be formed simultaneously with the second bank 60 in the same process. In this case, there is no need to perform a separate process for forming the filling layer 100, and therefore process defects due to the addition of the process may be minimized, thereby improving process yield.

Figure 10:
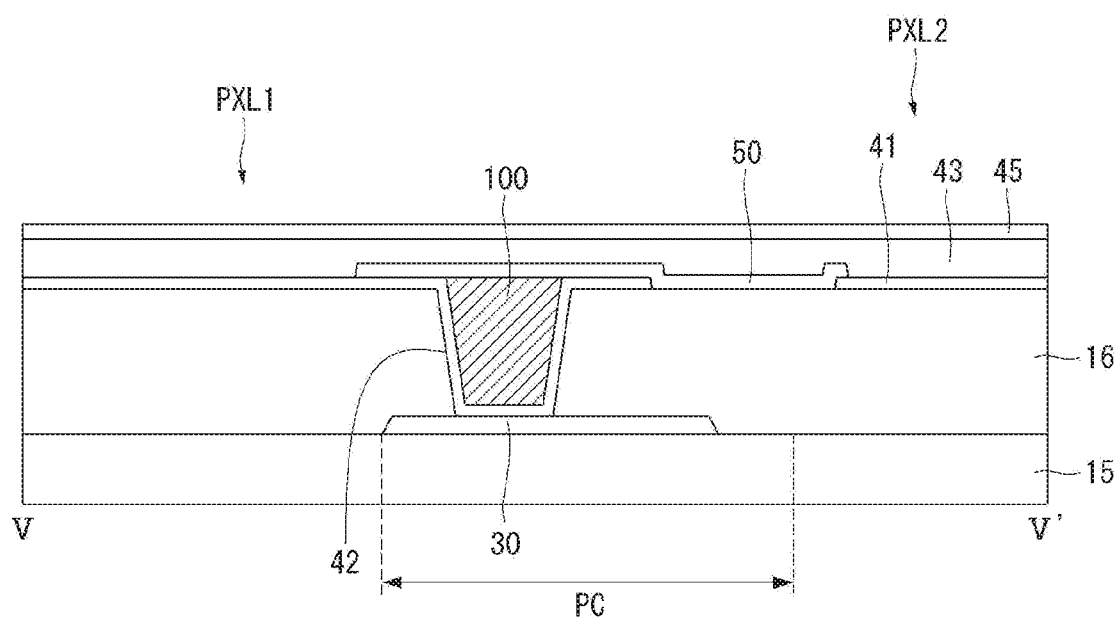
FIG. 10 a cross-sectional view showing an example alternative configuration according to the first exemplary embodiment of the present disclosure, taken along the line V-V' of FIG. 7A.

FIG. 10 a cross-sectional view showing an example alternative configuration according to the first exemplary embodiment of the present disclosure, taken along the line V-V' of FIG. 7A.

Referring to FIG. 10, the filling layer 100 may fill the pixel contact hole 42, and may be interposed between the first electrode 41 and the first bank 50. In this case, the first bank 50 may be flattened in shape without any stepped portion on the filling layer 100. For example, the filling layer 100 may be disposed on the first electrode 41 in the pixel contact hole 42, and the first bank 50 may extend over an upper surface of the filling layer 100 in the region in which the pixel contact hole 42 is formed, so that the first bank 50 does not extend into the pixel contact hole 42 and has a substantially flat surface throughout the pixel circuit portion PC. However, it should be readily appreciated that small variations in the flatness of the first bank 50 (e.g., small stepped portions) may exist at regions where the first bank 50 overlaps edges of the first electrode 41. Accordingly, the first exemplary embodiment of the present disclosure has the advantage of preventing abnormal light emission by effectively preventing division of the first bank 50 within the pixel circuit portion PC.

Figure 11:
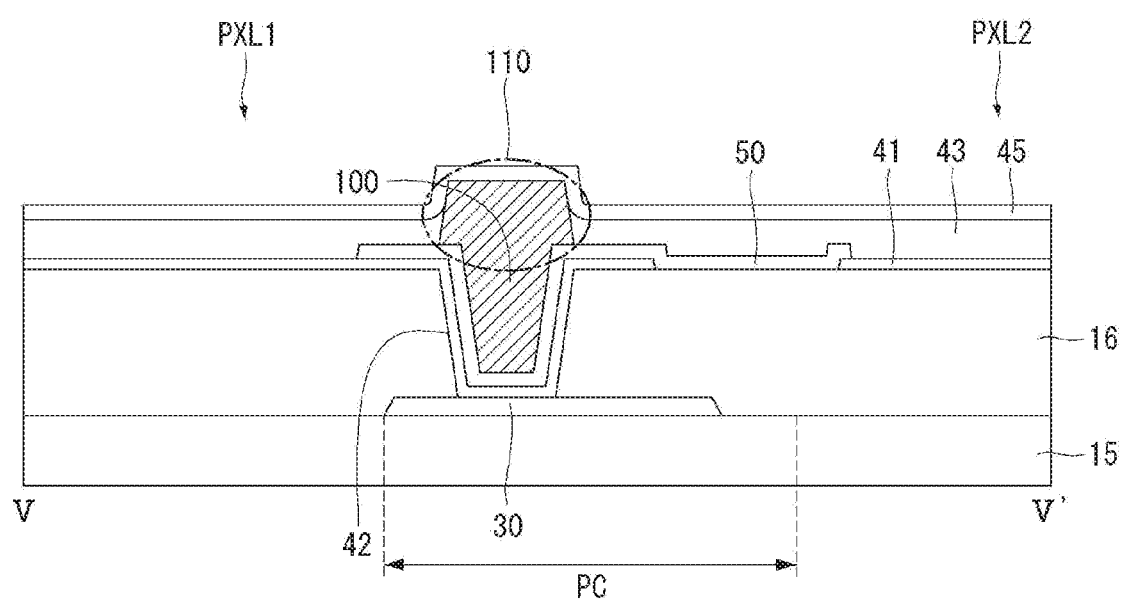
FIG. 11 a cross-sectional view showing an example alternative configuration according to the first exemplary embodiment of the present disclosure, taken along the line V-V' of FIG. 7A.

FIG. 11 a cross-sectional view showing another example alternative configuration according to the first exemplary embodiment of the present disclosure, taken along the line V-V' of FIG. 7A.

Referring to FIG. 11, the filling layer 100 may be configured to fill the pixel contact hole 42 and protrude outward from the pixel contact hole 42. That is, the filling layer 100 may comprise a protrusion 110 that protrudes outward from the pixel contact hole 42. The protrusion 110 may be a portion of the filing layer 100 that extends outwardly (e.g., in the vertical direction as shown in FIG. 11) beyond an upper portion of the pixel contact hole 42. The protrusion 110 may function as a spacer for preventing the light-emitting element in the light-emitting region from getting pressed and damaged when an external force is applied to the organic light-emitting display device. Unlike the conventional art, in the first exemplary embodiment of the present disclosure, only the first bank 50 with a shallow height is placed between neighboring pixels PXL1 and PXL2, so there may be a relative lack of means for mitigating and buffering impacts of pressing when an external force is applied. The first exemplary embodiment of the present disclosure has the advantage of providing an organic light-emitting display device that is robust against an applied external force by using the filling layer 100 with the protrusion 110. Furthermore, the filling layer 100 according to the first exemplary embodiment of the present disclosure may be firmly secured to its position without falling out due to the applied external force, since it is inserted into the pixel contact hole 42.

Meanwhile, if impurities are left behind when an organic light-emitting material is applied through the solution process, the organic light-emitting material may not spread uniformly over a preset region but may be clumped toward the impurities. As such, the thickness of the organic light-emitting layer 43 varies depending on the position, thus leading to a significant deterioration in display quality.

To prevent the clump formation, the filling layer 100 may be hydrophobic. For example, the filling layer 100 may be formed with a hydrophobic material coated on an organic insulating material or formed with an organic insulating material containing a hydrophobic material. In the former case, the hydrophobic material may be coated only on the protrusion 110 of the filling layer 100. Alternatively, the filling layer 100 may be formed simultaneously with the formation of the second bank 60 which is hydrophobic.

In the first exemplary embodiment of the present disclosure, the movement of organic light-emitting materials may be controlled by placing the hydrophobic filling layer 100 between neighboring pixels PXL1 and PXL2. Therefore, it is possible to effectively improve how much of the organic light-emitting material applied onto one pixel forms a lump toward impurities left on other pixels. Accordingly, the first exemplary embodiment of the present disclosure has the advantage of ensuring uniformity in the thickness of the organic light-emitting layer 43.

Second Exemplary Embodiment

Figure 12A:
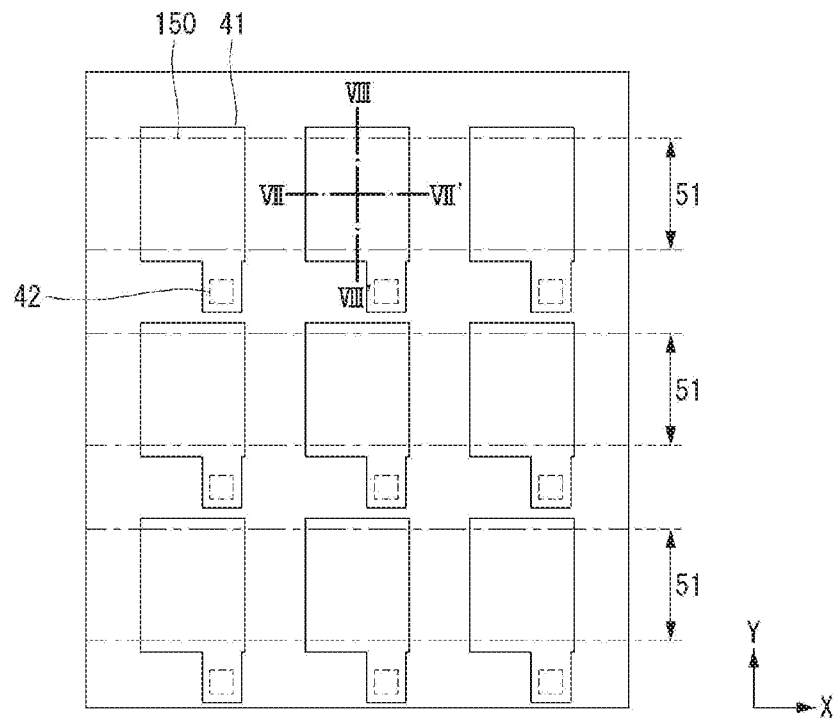
FIGS. 12A, 13A, and 14A are plan views a process of forming first electrodes, a first bank, a second bank, and an organic light-emitting layer according to a second exemplary embodiment of the present disclosure.
Figure 12B:
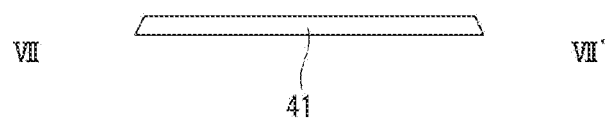
FIGS. 12B, 13B, and 14B are cross-sectional views taken along the lines VII-VII' of FIGS. 12A, 13A, and 14A, respectively.
Figure 12C:
FIGS. 12C, 13C, and 14C are cross-sectional views taken along the lines VIII-VIII' of FIGS. 12A, 13A, and 14A, respectively.
Figure 13A:
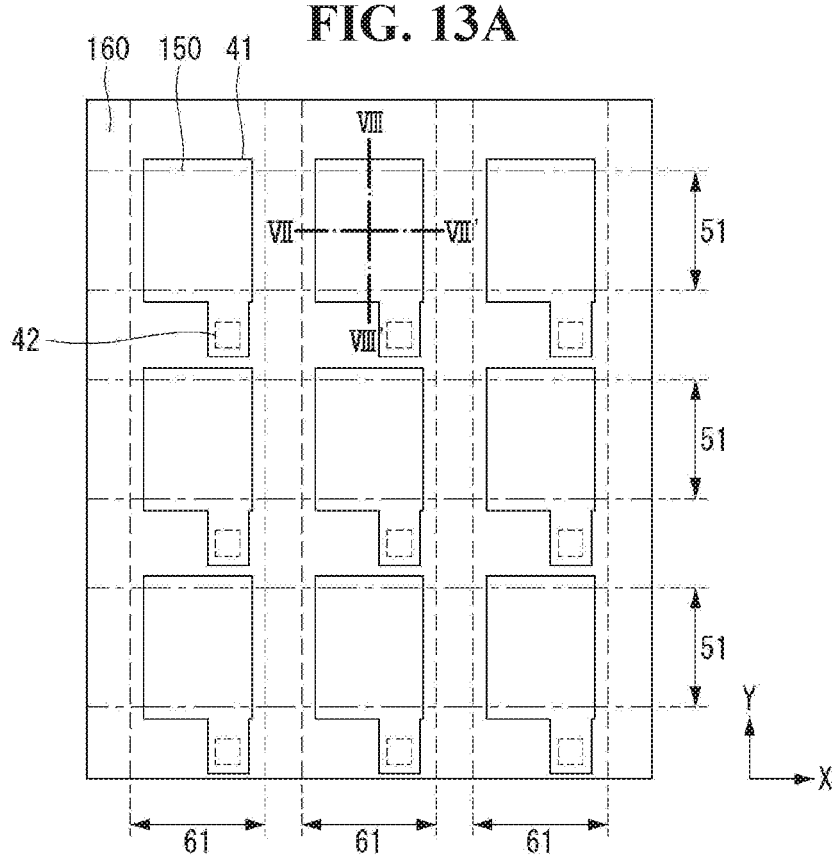
Figure 13B:
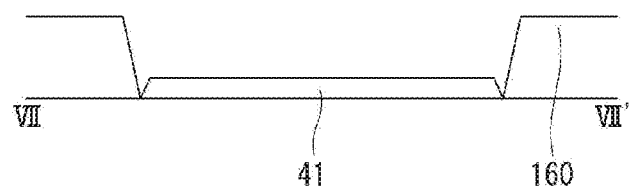
Figure 13C:
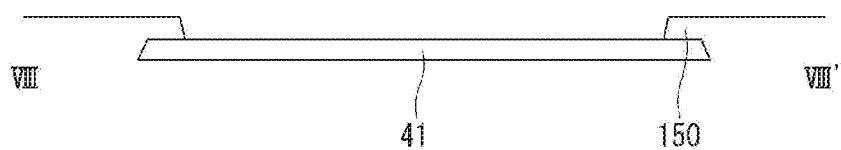
Figure 14A:
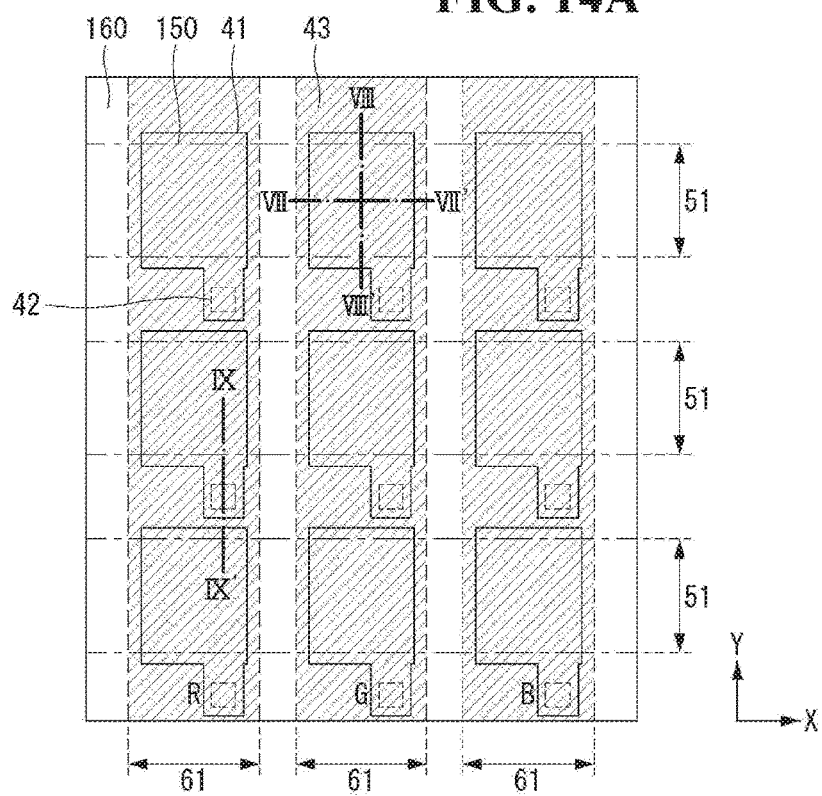
Figure 14B:
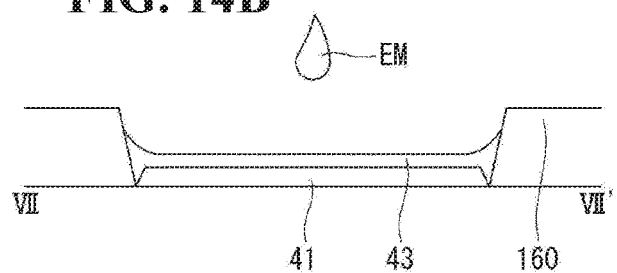
Figure 14C:
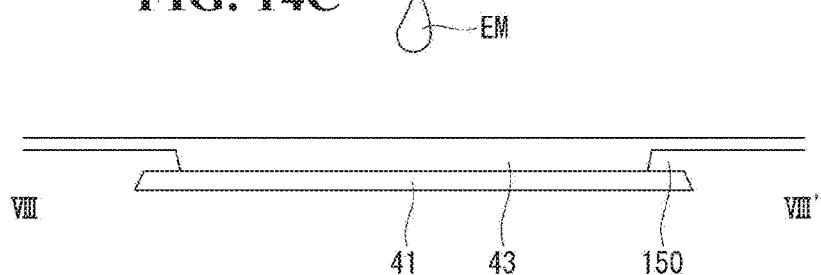

Hereinafter, an organic light-emitting display device according to a second exemplary embodiment of the present disclosure will be described with reference to FIGS. 12 to 15. FIGS. 12 to 14 are views showing a series process of forming first electrodes, a first bank, a second bank, and an organic light-emitting layer according to a second exemplary embodiment of the present disclosure. More particularly, FIGS. 12A, 13A, and 14A are schematic plan views illustrating the process of forming the first electrodes, first bank, second bank, and organic light-emitting layer, FIGS. 12B, 13B, and 14B are cross-sectional views taken along the line VII-VII' of FIGS. 12A, 13A, and 14A, respectively, and FIGS. 12C, 13C, and 14C are cross-sectional views taken along the line VIII-VIII' of FIGS. 12A, 13A, and 14A, respectively. For convenience of explanation, the process and structure prior to the formation of the first electrodes will be omitted.

Referring to FIGS. 12A, 12B, and 12C, the organic light-emitting display device comprises pixels arranged in first and second directions intersecting each other. Each pixel has a first electrode 41.

A first bank 150 is formed on a substrate where the first electrodes 41 are formed. The first bank 150 comprises a plurality of first openings 51. The first opening 51 exposes at least part of the first electrode 41. A plurality of first openings 51 are arranged in parallel in the first direction, and extend in the first direction. For example, each of the plurality of first openings 51 may have a long-axis that extends along the first direction (e.g., the X-axis direction), and the plurality of first openings 51 may be spaced apart from one another along the second direction (e.g., the Y-axis direction). The first openings 51 extend in the first direction and expose a plurality of first electrodes 41 arranged along the first direction. Alternatively, the first openings 51 may extend in the second direction (e.g., a long axis of the first openings 51 may extend in the Y-axis direction) and expose a plurality of first openings 51 arranged along the second direction. The number of first electrodes 41 or first openings 51 exposed by one first opening 51 may be different from the number of first electrodes 41 or first openings 51 exposed by another first opening 51.

Although the drawings illustrate that the first openings 51 are approximately rectangular, they are not limited to this shape, and the first openings 51 may have various different shapes in various embodiments. Also, the drawings illustrate that all of the first openings 51 have the same shape and area, but they are not limited to this and at least one first opening 51 may have a different shape and/or area from another first opening 51.

Referring to FIGS. 13A, 13B, and 13C, a second bank 160 is formed on the substrate where the first bank 150 is formed. The second bank 160 comprises a plurality of second openings 61. The second opening 61 exposes at least part of the first electrode 41. A plurality of second openings 61 are arranged in parallel in the second direction, for example, each of the plurality of second openings 61 may have a long-axis that extends in the second direction (e.g., the Y-axis direction). The second openings 61 extend in the second direction and expose a plurality of first electrodes 41 arranged along the second direction. For example, as shown in FIG. 13A, each of the second openings 61 may expose a plurality of first electrodes 41 which are arranged along the Y-axis direction. Alternatively, the second openings 61 may extend in the first direction (e.g., the X-axis direction) and expose a plurality of first openings 51 arranged along the first direction. The number of first electrodes 41 exposed by one second opening 61 may be different from the number of first electrodes 41 exposed by another second opening 61.

The second openings 61 extend in the second direction, and intersect a plurality of first openings 51 extending along the first direction. Parts of the first electrodes 41 exposed by the intersections of the first openings 51 and second openings 61 may be defined as light-emitting regions.

Although the drawings illustrate that the second openings 61 are approximately rectangular, they are not limited to this shape, and the second openings 61 may have various different shapes in various embodiments. Also, the drawings illustrate that all of the second openings 61 have the same shape and area, but they are not limited to this and at least one second opening 61 may have a different shape and/or area from another second opening 61. For example, the shape and/or area of the second openings 61 may be selected as desired in view of design considerations such as the lifetime of organic light-emitting materials EM.

Referring to FIGS. 14A, 14B, and 14C, the organic light-emitting layer 43 is formed on the substrate where the second bank 160 is formed. The organic light-emitting material EM forming the organic light-emitting layer 43 may be formed within the corresponding second openings 61, in the direction in which the second openings 61 extend. Thus, the applied organic light-emitting material EM covers parts of the first electrodes 41 and first bank 150 exposed by the second openings 61. The planar shape of the organic light-emitting layer 43 may correspond to the planar shape of the second openings 61. For example, the organic light-emitting layer 43 may have a striped pattern that extends in a planar view. For example, as shown in FIG. 14A, the organic light-emitting layer 43 may extend along the second direction (e.g., the Y-axis direction) and may have a shape that corresponds to the shape of the second openings 61 (which also extend along the second direction).

Organic light-emitting materials EM of different colors may be sequentially and alternately applied in their corresponding second openings 61. The organic light-emitting materials EM of different colors may comprise organic light-emitting materials EM that emit red (R), green (G), and blue (B) light, and in some embodiments, may further comprise an organic light-emitting material EM that emits white (W) light. For example, as shown in FIG. 14A, a first organic light-emitting layer that emits red (R) light may be disposed in a first one of the second openings 61, a second organic light-emitting layer that emits green (G) light may be disposed in a second one of the second openings 61, and a third organic light-emitting layer that emits blue (B) light may be disposed in a third one of the second openings 61.

Organic light-emitting material EM of the same color is applied on at least a plurality of first electrodes 41 exposed by one second opening 61. This means that a plurality of pixels defined at positions corresponding to one second opening 61 emit light of the same color. The second bank 160 is located between the first electrodes 41 adjacent to each other in the first direction (e.g., the X-axis direction), so that the organic light-emitting materials EM of different colors placed in the corresponding second openings 61 are kept from being mixed together. To this end, the second bank 160 may have a larger thickness than the first bank 150.

Referring further to FIGS. 7A, 7B, and 7C, in the organic light-emitting display device according to the first exemplary embodiment, both the first bank 150 and the second bank 160 are located between the pixels adjacent to each other in the first direction. In this case, the boundary of the first bank 150 should be spaced a preset or selected distance apart from the boundary of the second bank 160. Therefore, the first bank 150 masks the edges of the first electrodes 41 in the first direction by as much as the preset distance. In this case, the area of the light-emitting regions is reduced by as much as the first electrodes 41 are masked.

In contrast, in the organic light-emitting display device according to the second exemplary embodiment, the first bank 150 is not located between the pixels adjacent to each other in the first direction. That is, only the second bank 160 may be located between the pixels adjacent to each other in the first direction. Hence, in the second exemplary embodiment of the present disclosure, there are no positional constraints on the first bank 150, unlike the first exemplary embodiment, thereby providing wide light-emitting regions on the first electrodes 41. Therefore, the second exemplary embodiment of the present disclosure may provide an organic light-emitting display device that ensures a sufficiently large aperture ratio, compared to the first exemplary embodiment.

Figure 15:
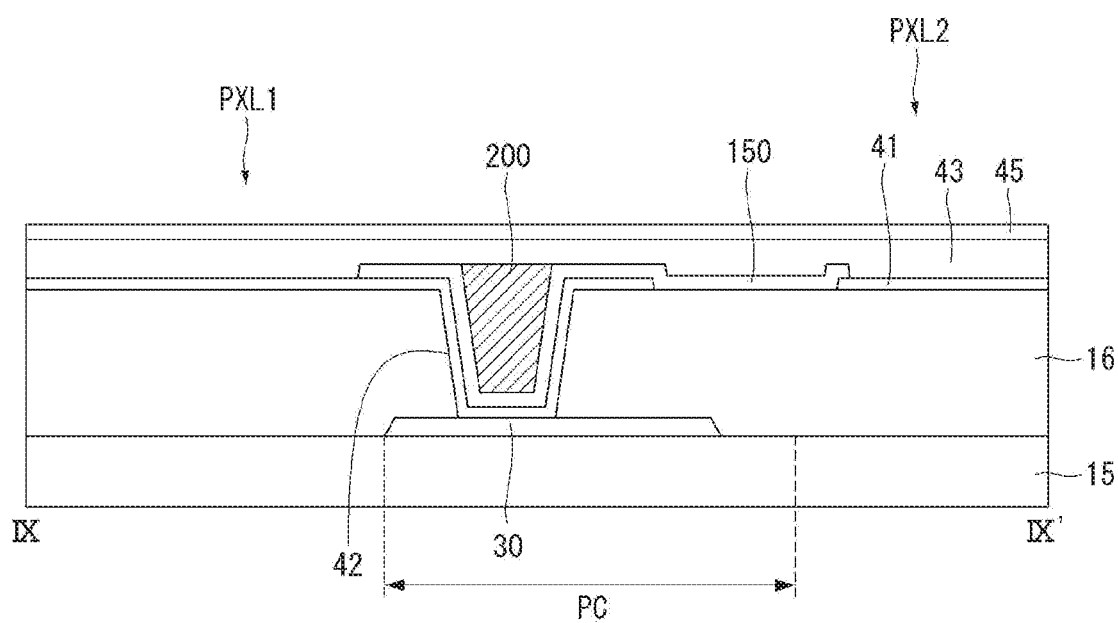
FIG. 15 is a cross-sectional view showing an example configuration according to the second exemplary embodiment of the present disclosure, taken along the line IX-IX' of FIG. 14A.

FIG. 15 is a cross-sectional view showing an example configuration according to the second exemplary embodiment of the present disclosure, taken along the line IX-IX' of FIG. 14A.

Referring to FIG. 15, as described above, in the organic light-emitting display device according to the second exemplary embodiment of the present disclosure, the second openings 61 of the second bank 160 extend in the second direction, so only the first bank 150, but not the second bank 160, is located between the pixels PXL1 and PXL2 adjacent to each other in the second direction. The first bank 150, within the second opening 61, separates the pixels PXL1 and PXL2 adjacent to each other in the second direction, and is placed in such a way as to cover a pixel circuit portion PC of at least one of the pixels PXL1 and PXL2 adjacent to each other in the second direction (e.g., the Y-axis direction).

More specifically, the organic light-emitting display device according to the second exemplary embodiment of the present disclosure comprises a TFT 30 placed on the substrate and an organic light-emitting diode electrically connected to the TFT 30. The organic light-emitting diode comprises a first electrode 41, a second electrode 45, and an organic light-emitting layer 43 interposed between the first electrode 41 and the second electrode 45. The TFT 30 is placed in the pixel circuit portion PC of the corresponding pixel. The TFT 30 and the first electrode 41 of the organic light-emitting diode are connected via a pixel contact hole 42 penetrating an insulating layer 16 interposed between them.

The first bank 150 is placed in the pixel circuit portion PC, on the substrate where the first electrode 41 is formed. The first bank 150 should be made relatively thin since it is an element covered by the organic light-emitting layer 43 as described above. Thus, the first bank 150 is formed along a stepped portion formed by the pixel contact hole 42, and its upper surface is not flattened but has a stepped portion corresponding to the stepped portion formed by the pixel contact hole 42. In other words, the pixel contact hole 42 is not filled with the first bank 150.

The organic light-emitting display device according to the second exemplary embodiment of the present disclosure further comprises a filling layer 200 for filling the pixel contact hole 42. The filling layer 200 is provided to fill the pixel contact hole 42, and prevents the organic light-emitting material forming the organic light-emitting layer 43 from entering the pixel contact hole 42 before hardening. If the filling layer 200 is not provided, the organic light-emitting material may locally enter only the pixel contact hole 42 formed in one region. This causes a difference in the thickness of the organic light-emitting layer 43 between the region the organic light-emitting material enters and the other regions, thereby leading to a significant deterioration in the display quality of the display device. By including the filling layer 200, the second exemplary embodiment of the present disclosure may prevent the problem of deterioration in the thickness uniformity of the organic light-emitting layer 43 which occurs when organic light-emitting material unintentionally enters the pixel contact hole 42. The filling layer 200 may be formed of any dielectric or electrically insulating material in various embodiments.

Moreover, the pixel contact hole 42 is made thick and deep due to the process characteristics, because it is formed through the insulating layer 16 with a relatively large thickness. Since the first bank 150 is formed along the stepped portion of the pixel contact hole 42, it may be possible that portions of the first bank 150 do not fully cover the first electrode 41 placed in the pixel circuit portion PC but may be divided in one region and may expose the first electrode 41. In this case, the first electrode 41 and the organic light-emitting layer 43 may come into contact with each other in the exposed region, thus causing the problem of abnormal light emission. However, in the second exemplary embodiment of the present disclosure, the filling layer 200 is placed on the first bank 150 within the pixel contact hole 42, so the corresponding region may be masked through the filling layer 200. That is, any portions of the first electrode 41 that are not fully covered by the first bank 150 within the pixel contact hole 42 are covered by the filling layer 200, thereby preventing contact between the first electrode 41 and the organic light-emitting layer 43 in the pixel contact hole 42. Accordingly, the second exemplary embodiment of the present disclosure has the advantage of preventing abnormal light emission even if the first bank 150 is divided or discontinuous within the pixel circuit portion PC.

Although not shown, the organic light-emitting display device according to the second exemplary embodiment of the present disclosure may have a structure in which the filling layer 200 is made of the same material as the second bank 160 as shown in FIG. 9 in the first exemplary embodiment, may have a structure in which the filling layer 200 fills the pixel contact hole 42 and is interposed between the first electrode 41 and the first bank 150 as shown in FIG. 10 in the first exemplary embodiment, or may have a structure in which the filling layer 200 comprises a protrusion that protrudes outward from the pixel contact hole 42 as shown in FIG. 11 in the first exemplary embodiment.

It will be apparent that those skilled in the art can make various modifications and changes thereto within the scope without departing from the technical spirit of the present disclosure through the above descriptions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device, comprising:
   a plurality of pixels arranged along first and second directions that intersect each other, each of the pixels each including:
   a transistor;
   at least one insulating layer on the transistor, a pixel contact hole extending through the at least one insulating layer and exposing part of the transistor;
   a first electrode on the at least one insulating layer and connected to the transistor via the pixel contact hole; and
   a filling layer on the first electrode and filling the pixel contact hole;
   a first bank having a plurality of first openings, each of the first openings exposing at least one of the first electrodes; and
   a second bank having a plurality of second openings, each of the second openings exposing a plurality of the first electrodes arranged along the second direction,
   wherein the pixel contact hole overlaps the first bank and does not overlap the second bank.

2. The organic light-emitting display device of claim 1, wherein the filling layer is on the first bank.

3. The organic light-emitting display device of claim 2, wherein the filling layer includes a protrusion that protrudes outward from the pixel contact hole.

4. The organic light-emitting display device of claim 3, wherein the filling layer is hydrophobic.

5. The organic light-emitting display device of claim 1, wherein the filling layer is formed on the first bank and is made of a same material as the second bank.

6. The organic light-emitting display device of claim 1, wherein the filling layer is interposed between the first electrode and the first bank.

7. The organic light-emitting display device of claim 1, wherein the first bank is hydrophilic, and the second bank is hydrophobic.

8. The organic light-emitting display device of claim 1, wherein each of the first openings exposes one of the first electrodes.

9. The organic light-emitting display device of claim 1, wherein each of the first openings of the first bank exposes a plurality of the first electrodes arranged along the first direction.

10. The organic light-emitting display device of claim 9, wherein a number of the first electrodes exposed by one of the first openings is different from a number of the first electrodes exposed by another of the first openings.

11. The organic light-emitting display device of claim 9, wherein an area or shape of one of the first openings is different from an area or shape of another of the first openings.

12. The organic light-emitting display device of claim 1, wherein a number of the first electrodes exposed by one of the second openings is different from a number of the first electrodes exposed by another of the second openings.

13. The organic light-emitting display device of claim 1, wherein an area or shape of one of the second openings is different from an area or shape of another of the second openings.

14. The organic light-emitting display device of claim 1, further comprising an organic light-emitting layer in the second openings, the organic light-emitting layer covering the first electrodes and portions of the first bank exposed by the second openings.

15. The organic light-emitting display device of claim 1, wherein the second bank has a larger thickness than the first bank.

16. An organic light-emitting display device, comprising:
   a plurality of pixels arranged in rows extending along a first direction and columns extending along a second direction transverse to the first direction, each of the pixels including an organic light-emitting diode having a first electrode, a transistor, at least one insulating layer on the transistor, a pixel contact hole extending through the at least one insulating layer and a filling layer filling the pixel contact hole;
   a first bank having a plurality of first openings, each of the first openings exposing a first plurality of the first electrodes along the first direction; and
   a second bank having a plurality of second openings, each of the second openings exposing a second plurality of the first electrodes along the second direction,
   wherein each of the plurality of first openings overlaps two or more of the second openings
   wherein the first bank is hydrophilic, the second band is hydrophobic and the filling layer is made of a same material as the second bank.

17. The organic light-emitting display device of claim 16, further comprising:
   a first organic light-emitting layer in a first one of the plurality of second openings;
   a second organic light-emitting layer in a second one of the plurality of second openings; and
   a third organic light-emitting layer in a third one of the plurality of second openings,
   wherein the first, second, and third organic-light emitting layers emit light of different colors.

18. The organic light-emitting display device of claim 16, wherein the pixel contact hole:
   exposes part of the transistor, the first electrode disposed on the at least one insulating layer and connected to the transistor via the pixel contact hole.

19. An organic light-emitting display device, comprising:
   a plurality of pixels arranged along first and second directions that intersect each other, each of the pixels including:
   a transistor;
   an insulating layer on the transistor, a pixel contact hole extending through the insulating layer and exposing part of the transistor;
   a first electrode on the insulating layer and connected to the transistor via the pixel contact hole; and
   a filling layer on the first electrode and filling the pixel contact hole;
   a first bank on the first electrode having a plurality of first openings, each of the first openings exposing the first electrodes; and
   a second bank on the second bank,
   wherein the first bank is hydrophilic, the second bank is hydrophobic and the filling layer is made of a same material as the second bank.

* * * * *